(12) United States Patent
Park et al.

(10) Patent No.: US 6,812,191 B2
(45) Date of Patent: Nov. 2, 2004

(54) SUPERCONDUCTING BODIES MADE OF ZINC-DOPED COPPER OXIDE MATERIAL

(75) Inventors: Jai Won Park, Goettingen (DE); Karl Koehler, Diekholzen (DE); Ferdinand Hardinghaus, Bad Hoenningen (DE); Hans Gabel, Kasbach-Ohlenberg (DE); Gernot Krabbes, Heidenau (DE); Peter Schaetzle, Dresden (DE); Gudrun Stoever, Dresden (DE)

(73) Assignee: Solvay Barium Strontium GmbH, Hannover (DE)

( * ) Notice: Subject to any disclaimer, the term of this patent is extended or adjusted under 35 U.S.C. 154(b) by 318 days.

(21) Appl. No.: 09/931,387

(22) Filed: Aug. 17, 2001

(65) Prior Publication Data

US 2002/0173427 A1 Nov. 21, 2002

Related U.S. Application Data

(63) Continuation of application No. PCT/EP00/00980, filed on Feb. 8, 2000.

(30) Foreign Application Priority Data

| Feb. 17, 1999 | (DE) | ........................................ 199 06 748 |
| Mar. 24, 1999 | (DE) | ........................................ 199 13 213 |
| Sep. 13, 1999 | (DE) | ........................................ 199 43 838 |

(51) Int. Cl.[7] .......................................... C04B 101/00
(52) U.S. Cl. ...................... 505/121; 505/125; 505/510
(58) Field of Search ................................ 505/121, 125, 505/780, 782, 510

(56) References Cited

U.S. PATENT DOCUMENTS

| 4,880,771 A | 11/1989 | Cava et al. |
| 4,988,670 A | 1/1991 | Itozaki et al. |
| 4,990,488 A | 2/1991 | Schnering |
| 5,034,373 A | 7/1991 | Smith et al. |
| 5,047,391 A | 9/1991 | Bock |
| 5,075,285 A | 12/1991 | Flukiger |
| 5,096,878 A | 3/1992 | Hoshino et al. |
| 5,140,003 A | 8/1992 | Mueller |
| 5,145,831 A | 9/1992 | Yamada et al. |
| 5,306,700 A * | 4/1994 | Hojaji ......................... 505/450 |
| 6,043,198 A * | 3/2000 | Neubacher et al. .......... 505/121 |
| 6,063,735 A | 5/2000 | Park et al. |
| 6,258,743 B1 * | 7/2001 | Fleming et al. ............. 505/450 |

FOREIGN PATENT DOCUMENTS

| DE | 3803680 | 8/1989 |
| DE | 3826924 | 2/1990 |
| DE | 3739886 | 2/1991 |
| DE | 3731266 | 12/1991 |
| DE | 4216545 | 12/1993 |

(List continued on next page.)

OTHER PUBLICATIONS

Zhou et al "Enhancement in transport properties of seed melt-textured YBCO by Cu-site Doping", Supercon. Sci. Tech. 15 (2003) 722–726.*

(List continued on next page.)

*Primary Examiner*—Mark Kopec
(74) *Attorney, Agent, or Firm*—Crowell & Moring LLP

(57) ABSTRACT

Superconductive bodies composed of cuprate material having a very critical current density with outer magnetic fields of up to 5 tesla when the bodies have a content of zinc cations. The bodies can also be subjected to modified oxygen treatment. The preferred cuprate materials are YBCO material and bismuth oxide based on superconductive material such as "2212" or "2223" type superconductive material. The preferred bodies are molded bodies obtained by melt texturing and "powder-in-tube" bodies.

16 Claims, 1 Drawing Sheet

Critical Current Strength plotted vs. Field Strength

FOREIGN PATENT DOCUMENTS

| | | |
|---|---|---|
| DE | 19623050 | 12/1997 |
| EP | 0292385 | 11/1988 |
| EP | 0299870 | 1/1989 |
| EP | 0330214 | 8/1989 |
| EP | 0330305 | 8/1989 |
| EP | 0332291 | 9/1989 |
| EP | 0336450 | 10/1989 |
| EP | 0339801 | 11/1989 |
| EP | 354616 | 2/1990 |
| EP | 0354616 | 2/1990 |
| EP | 0375134 | 6/1990 |
| EP | 0434372 | 6/1991 |
| EP | 0362492 | 9/1991 |
| EP | 0388754 | 8/1992 |
| GB | 2314076 | 12/1997 |
| JP | 63315566 | 12/1988 |
| JP | 330-305 | * 8/1989 |
| WO | WO8805029 | 7/1988 |
| WO | WO9706567 | 5/2000 |

OTHER PUBLICATIONS

Aldrich Products for Superconductivity Research (1990–1991), pp. 17, 18, 20.*

G.K. Bichile, "Enhanced flux pinning by Zn substitution in $YBa_2Cu_3O_{7-\delta}$" Supercond. Science Technology, 1991.

M. Affronte, "High–Temperature relaxation processes in Zn and Fe doped tetragonal YBCO" Physica C, 1994.

R.K. Nkum, "Substitution of 3d metals for Cu in $(Bi,Pb)_2Sr_2Ca_2Cu_3O_y$," Physica C, 1994.

C. Tome–Rosa, "Impurity Pinning in Epitaxial $YBa_2(Cu_{1-x}TM_x)_3O_{7-\delta}$ (TM=$Zn_3$,Ni)–Thin Films" IEEE Translations on Applied Superconductivity, 1993.

J.M.S. Skakle, "Crystal chemical substitutions and doping of $YBa_2Cu_3O_x$ and related superconductors" Materials Science and Engineering, 1998.

* cited by examiner

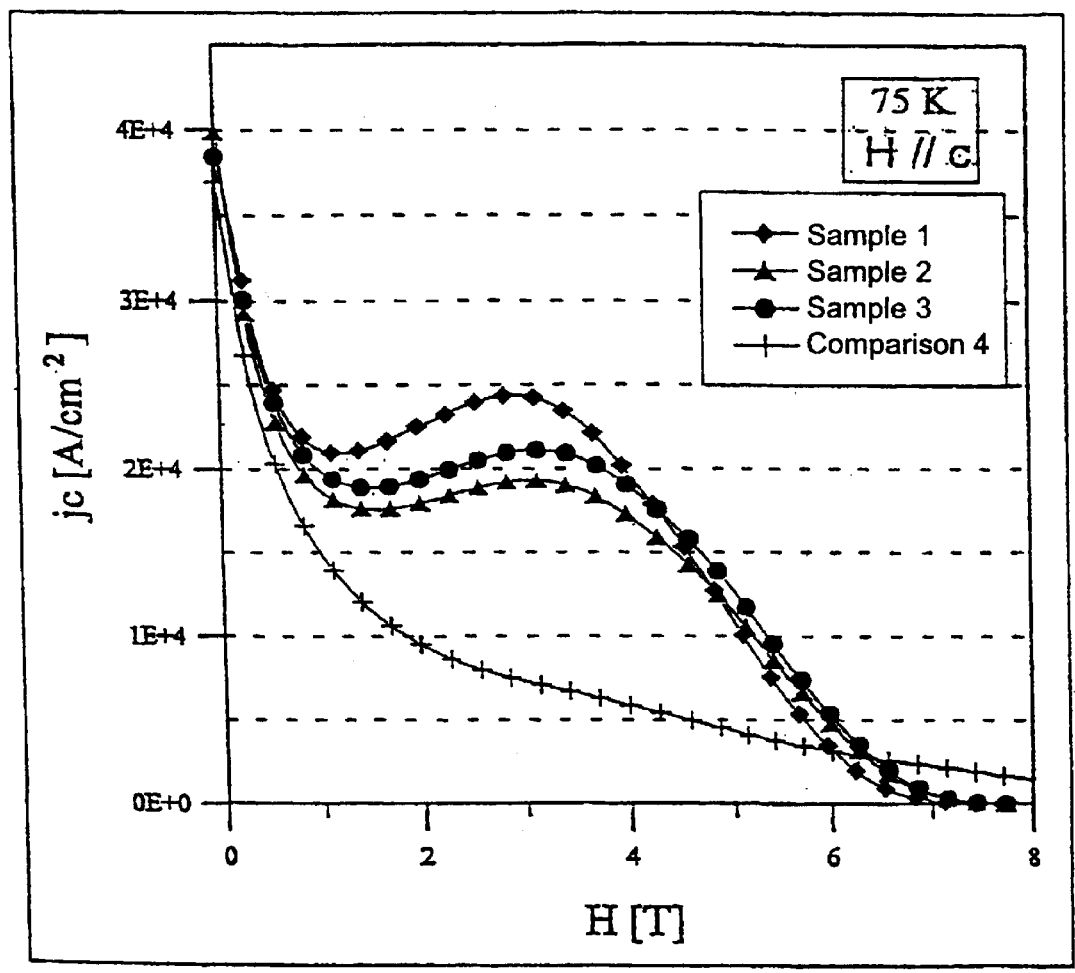
Critical Current Strength plotted vs. Field Strength

SUPERCONDUCTING BODIES MADE OF ZINC-DOPED COPPER OXIDE MATERIAL

CROSS REFERENCE TO RELATED APPLICATIONS

This application is a continuation of International Patent Application No. PCT/EP00/00980, filed Feb. 8, 2000, designating the United States of America, the entire disclosure of which is incorporated herein by reference. Priority under the Paris Convention is claimed based on Federal Republic of Germany Patent Application Nos. DE 199 06 748.1, filed Feb. 17, 1999; DE 199 13 213.5, filed Mar. 24, 1999; and DE 199 43 838.2, filed Sep. 13, 1999.

BACKGROUND OF THE INVENTION

This invention relates to cuprate-based superconducting bodies, a powder that can be used for their production, and the use of such bodies.

The term "superconducting bodies based on cuprate material" in this application denotes all those oxide ceramics (in the form of molded bodies, films, applied to strip or substrates, wire, "powder-in-tube," or used as the target in a coating process), which contain CuO and have superconducting properties at a sufficiently low temperature.

Superconducting bodies, e.g., molded bodies, can be used, for instance, in cryomagnetic applications in relatively high external magnetic fields. They can, for example, be superconducting wires or components in electric motors. As a function of the strength of the external magnetic field it has been observed that the drop in the critical current density is all the more pronounced the greater the external magnetic field is.

SUMMARY OF THE INVENTION

It is the object of the present invention to provide superconducting bodies based on cuprate material with an increased critical current density in the presence of external magnetic fields.

This and other objects have been attained in accordance with the present invention by providing a superconducting molded body based on a cuprate material and obtained by melt texturing, wherein said body has a zinc cation content of 50 to 5000 ppm by weight.

In accordance with a further aspect of the invention, the object of the invention have been attained by providing a cuprate powder for producing superconducting material, said powder having a zinc cation content in an amount of 50 ppm to 1000 ppm by weight and a grain size distribution of $d_{90\%}$ of less than 35 μm determined by a CILAS laser granulometer.

The superconductive body of the present invention may be formed into various superconductive articles including, e.g., a superconducting cable, permanent magnet, short circuit current limiter, transformer, generator, SMES, flywheel energy storage system, high-field magnet, electromagnet or superconducting magnetic bearing.

The superconducting bodies based on cuprate material according to the invention are characterized by a zinc cation content of 50 to 5000 ppm. The zinc is typically present in the form of the oxide. Preferred are bodies with a zinc-cation content ranging from 100 to 1000 ppm. This weight range preferably refers to the superconducting phase in the body (auxiliary material, such as special additives, fillers, targets and any interlayers, other substrates or (silver) tubes in powder-in-tube bodies are then not included in the calculation).

Bodies based on cuprate material with the inventive zinc cation content generally have the advantages of the invention. A preferred cuprate material is a cuprate material of the rare earth metal alkaline-earth metal cuprate type, particular yttrium barium cuprate as well as cuprate material of the bismuth (lead) alkaline-earth metal copper oxide type. These materials are known per se; well-suited materials have already been mentioned above. Bismuth strontium calcium cuprate with an atomic ratio of 2:2:1:2 and 2:2:2:3 is especially suitable. In the latter, a portion of the bismuth may be replaced with lead. Bismuth strontium calcium cuprates with modifications in the stoichiometry of the aforementioned atomic ratios can of course also be used.

Superconducting cuprate material and the manner of producing it (e.g., film formation, melt texturing, etc.) are known per se.

Particularly suitable, for instance, are the rare earth metal alkaline-earth metal cuprates described in WO 88/05029, especially $YBa_2Cu_3O_{7-x}$ ("YBCO"), bismuth (lead) alkaline-earth metal cuprates, such as bismuth strontium calcium cuprates and bismuth lead strontium calcium cuprates, especially of the 2212-type (Bi:Sr:Ca:Cu=2:2:1:2) and of the 2223-type (Bi:Sr:Ca:Cu=2:2:2:3). Here a portion of the Bi may be replaced with lead. Bi-containing cuprates are described, for example, in EP 336,450; U.S. Pat. No. 4,990,488 (=DE 37 39 886); U.S. Pat. No. 5,145,831 (=EP 330,214); U.S. Pat. No. 4,880,771 (=EP 332,291) and EP 330,305.

The conversion of the raw materials (metal oxides or carbonates) into a superconducting powder is known.

German patent DE 42 16 545 discloses such a process. In a multistage heat treatment the material is heated to a temperature of 950° C. and is then cooled again.

Various types of bodies may be produced, e.g., molded bodies, particularly by melt texturing. Park et al., U.S. Pat. No. 6,063,735 (=WO 97/06567) discloses a yttrium barium cuprate mixture, which is particularly suitable for the production of melt-processed high temperature superconductors with high levitation force. Important in this mixture is that it contains less than 0.6% by weight of free copper oxide that is not bound in the yttrium barium cuprate phase and less than 0.1% by weight carbon. In the melt texturing process, additives are added, which form "pinning" centers or promote their formation. These centers permit an increase in the critical current density in the superconductor. Additives enhancing flux pinning are, for instance $Y_2BaCuO_5$, $Y_2O_3$, $PtO_2$, $Ag_2O$, $CeO_2$, $SnO_2$, $ZrO_2$, $BaCeO_3$ and $BaTiO_3$. These additives may be added in amounts ranging from 0.1 to 50% by weight, where the yttrium barium cuprate powder is set at 100% by weight. Platinum oxide, for instance, is advantageously used in an amount of 0.5 to 5% by weight.

Other bodies, for instance, are thin films, see EP 354,616 (=DE 38 26 924) (deposition from a homogenous solution), thick films in the form of strip or wire with interlayer by calcination of a precursor phase deposited on the substrate, see U.S. Pat. No. 5,096,878 (=EP 339,801), film deposition by PVD process, see U.S. Pat. No. 4,988,670 (=EP 299,870), CVD process, see U.S. Pat. No. 5,140,003 (=EP 388,754), and wire in the form of a ceramic powder-filled metal tube (powder-in-tube technology), see U.S. Pat. No. 5,075,285 (=DE 37 31 266).

EP 375,134 discloses a glass-ceramic molded body, while U.S. Pat. No. 5,047,391 (=EP 362,492) describes a casting solidified from the melt.

Zinc cations have proven to be of crucial importance. Those superconducting materials, e.g., made of rare earth metal alkaline-earth metal cuprate, which do not already contain strontium, calcium and/or aluminum as lattice components (e.g., in Bi, Pb—Sr—Ca cuprates), advantageously also contain other foreign metal ions through Zn zinc cations, namely strontium, calcium and/or aluminum. These foreign metal ions are ions of other metals besides those that are added as flux pinning additives as described above.

BRIEF DESCRIPTION OF THE DRAWING

The drawing FIGURE is a graph showing a plot of the critical current strength verses field strength for three sample superconductive bodies according to the present invention and a comparison body.

DETAILED DESCRIPTION OF PREFERRED EMBODIMENTS

The invention will now be described in greater detail with reference to preferred embodiments, namely bodies based on yttrium barium cuprate.

Strontium is advantageously present in an amount of 100 to 200 ppm, calcium in an amount of 30 to 100 ppm. The aluminum content preferably ranges from 2 to 100 ppm, preferably 2 to 10 ppm. The total amount of zinc-strontium-calcium and aluminum cations is 5500 ppm at maximum, preferably 1200 ppm at maximum.

The bodies according to the invention can take a wide variety of forms. They may be present in the form of films, for instance. These can be films on flexible strip or wire, on plate or monocrystalline substrates. Buffer films may optionally be arranged according to the invention between the substrate and the superconducting film. These films may be thin films or thick films. They can be produced by electrophoretic deposition, dip coating, liquid phase epitaxy, spray pyrolysis, sputtering, laser ablation, metal evaporation or CVD processes. Some particularly suitable methods are discussed in the initially cited documents. Another form in which the superconducting bodies according to the invention may be present is powder-in-tube. In this case, the material according to the invention is present in powder form inside a metal tube (for instance made of silver). These are flexible, wire-like structures.

In one preferred embodiment of the invention, the inventive body takes the form of a molded body. These molded bodies can be obtained by melt texturing as well as by explosive compacting, by allowing a molten material to solidify, etc. Particularly preferred are molded bodies obtained by melt texturing.

A further object of the invention is to provide superconducting molded bodies whose critical current density is constant at a particularly high level irrespective of the external magnetic field and over a relatively wide range.

This object is attained in that the above-described inventive molded bodies are subjected to a specific $O_2$ treatment. According to the invention, the molded bodies are heated in a pure $O_2$ atmosphere or in an inert mixture (e.g., $N_2$ or a noble gas) with an $O_2$ content of 0.1 to 20% by weight at a temperature of 300° to 570° C. for 50 to 200 hours and are then slowly cooled. This is a preferred embodiment of the invention.

A particularly preferred embodiment of the invention relates to molded bodies obtained by melt texturing. The melt texturing process is known per se. See, U.S. Pat. No. 6,063,735 (=WO 97/06567) and GB 2,314,076 (=DE 196 23 050). The starting material is cuprate powder. The powder can be produced in a known manner by mixing the oxides, hydroxides or carbonates of the desired metals.

The invention also relates to a cuprate powder which contains zinc cations in an amount of 50 to 5000 ppm, even in an amount of 50 to 7500 ppm, preferably 100 to 1000 ppm, and especially a yttrium barium cuprate powder and bismuth (lead) strontium calcium cuprate powder (2:2:1:2 type and 2:2:2:3 type). It has proven advantageous if the powder according to the invention has a grain size distribution in which 90% of all particles have a diameter of less than 35 $\mu$m. The zinc cation content in the cuprate powder can be up to 7500 ppm if additives, e.g., flux pinning materials, are introduced.

As a specific example of the invention, we will now describe molded bodies produced by melt texturing yttrium barium cuprate powder.

The $YBa_2Cu_3O_{7-x}$ powder, which preferably already contains the zinc cations (and optionally Sr, Ca and/or Al ions) can be converted into molded bodies in a known manner. It is typically pressed and shaped, i.e., it is formed by compaction.

The powder may be produced in a known manner by mixing yttrium oxide, barium oxide and copper oxide or their molded bodies. Usually, yttrium is used in the form of yttrium oxide, copper in the form of copper oxide and barium in the form of barium carbonate.

The molded bodies according to the invention are produced by mixing the inventive powder with the desired flux pinning additive, if necessary grinding it to obtain the desired grain size, and subjecting it to a heat treatment. For this purpose, the powder is advantageously uniaxially pressed into green compacts. After that melt texturing is performed.

The bodies according to the invention, particularly the inventive molded bodies, have the advantage of a substantially higher critical current density that is constant over a wide range in the presence of an external magnetic field acting on the bodies in contrast to bodies produced for comparison which at most have a low content (>50 ppm) of zinc cations. The higher critical current density is noticeable even at low field strengths, e.g., in the range of 0 to 1 tesla. In a field strength range of 0 to 5 tesla, preferably 0.1 to 4 tesla of the external magnetic field, the bodies according to the invention have a nearly constant current density at a very high level. The levitation force is very high. In serial investigations it has been found that a further advantage of the presence of zinc cations (and optionally other foreign metal ions mentioned above, such as strontium or calcium) is the substantially reduced scattering of the properties of the individual samples (levitation force, remanent induction, current density).

Due to the increased constant critical current density in the presence of an external magnetic field, either in the range of 0 to 5 tesla or preferably 0.1 to 4 tesla, the bodies according to the invention are particularly well suited for industrial applications. For instance, the material is generally suitable for power supplies, electrically conductive cables or poles in electric motors.

Material of the 2—2-1-2 type is suitable, for example, for producing short circuit current limiters, high-field magnets and power supplies. Material of the 2—2—2-3 type is suitable, for instance, for producing current transport cables, transformers, SMES (Superconducting Magnetic Energy Storage), windings for electric motors, generators, high-field magnets, power supplies and short circuit current limiters. One advantage, for instance, is that these components can be made more compact and have greater efficiency than heretofore possible.

The following description is intended to illustrate the invention in greater detail with examples of YBCO material without, however, limiting the scope of the invention.

General Production Specifications for Melt Textured Molded Bodies:

a) Production of the Powder:

Yttrium oxide, barium carbonate and copper oxide were used in amounts so that the atomic ratio of yttrium, barium and copper was adjusted to 1:2:3. The foreign metal ions were added to the copper oxide starting material and thus introduced into the powder. The starting products were homogenized and pressed. They were then decarbonized in a heat treatment. For this purpose, they were slowly heated to a final temperature of 940° C., held at this temperature for several days and then slowly cooled. The product thus obtained was then crushed and ground in a jet mill. It was subsequently pressed again and subjected to another heat treatment in a stream of oxygen. It was slowly heated to 940° C. and held at this temperature for several hours. It was then allowed to cool slowly to ambient temperature. It was crushed, screened, and the screened fine material was dry-milled in a ball mill. The $d_{90\%}$ value (grain size distribution determined in a Cilas laser granulometer) was less than 30.5 $\mu$m for all specimens. The following table gives quantitative analysis data for the strontium content, calcium content and zinc content of three samples according to the invention (samples 1 to 3) and a reference sample (sample 4).

TABLE 1

Quantitative analysis of the $YBa_2Cu_3O_{7-x}$ starting powder with respect to foreign metal ions (parts per million by weight)

| Sample No. | Sr | Ca | Al | Zn | Other (Na, Si, Fe, Bi, Pb, Zr, Ni, Co) | Total |
| --- | --- | --- | --- | --- | --- | --- |
| 1 | 158 | 59 | 10 | 295 | 144 | 666 |
| 2 | 117 | 43 | 05 | 295 | 12 | 580 |
| 3 | 125 | 41 | 09 | 300 | 125 | 600 |
| 4 | 166 | 20 | 27 | 003 | 09 | 306 |

The powder was again homogenized by milling with 12% by weight $Y_2O_3$ and 1% by weight Pt powder as flux pinning additives. This powder was uniaxially pressed into green compacts, 30 mm in diameter and 18 mm high. These green compacts were stored under argon until melt processing.

At the start of melt processing, oriented seed crystals of samarium barium cuprate were placed on the green compacts. The green compacts of all three samples 1 to 3 to be examined and the green compacts of the comparison sample 4 were simultaneously brought to crystallization (melt texturing) in the homogenous temperature zone of a reactor. After melt texturing, the yttrium barium cuprate monoliths were loaded with oxygen. Their upper side was then ground and polished.

The critical current density ($j_c$) as a function of an external magnetic field was determined at 75 K on small samples (diameter=4 mm, height=2 to 3 mm), which were drilled out of the yttrium barium cuprate monoliths. Subsequently, the critical current density was measured at increasing field strengths of an external magnetic field (from 0 to 8 tesla). The measuring points are shown in FIG. 1 in which the critical current density is plotted against the external magnetic field. The measuring points of FIG. 1 demonstrate the following: The comparison sample 4 shows a continuous decrease in the critical current density with increasing external magnetic field. The samples 1 to 3 according to the invention, in the range of up to about 1.5 tesla, show a continuous but smaller decrease in the critical current density in contrast to the comparison sample. Starting from 1.5 tesla, the critical current density increases again in the samples according to the invention until it reaches a maximum value with 3 tesla. With further increasing field strengths, the value for the critical current density slowly decreases also in the samples according to the invention. Up to a field strength of 6 tesla, however, the value is always higher than in the comparison sample 4.

General Specification for Producing Oxygen-Treated Monoliths:

The charging of the monoliths with oxygen according to the invention is effected in one embodiment by heating the molded bodies at a temperature of between 480° and 520° C. over a period of 50 hours, preferably 100 to 200 hours, in a pure $O_2$ atmosphere and subsequent cooling.

In another embodiment of the invention, the $O_2$ treatment of the molded bodies is carried out at a temperature of between 300° and 500° C. if an inert gas mixture, which in addition to $N_2$, Ar or other inert gases contains $O_2$ at a concentration of between 0.1 and 20% by weight is used instead of a pure $O_2$ atmosphere.

Molded bodies which, in addition to the increased Zn content, have the yttrium partly replaced with bivalent cations, e.g., Sr, Ca, Mg, are advantageously heated at a temperature that is 30° to 50° C. higher than the aforementioned temperatures used in an $O_2$ or an $O_2$-containing gas mixture and are subsequently cooled.

Also in terms of the invention, the molded bodies are initially held at a temperature of 550° to 600° C. for up to 100 hours. The molded bodies are either heated to this temperature or they are cooled to this temperature after melt processing. The molded bodies pretreated in this manner are then subjected to the above-described oxygen treatment.

The critical current density ($j_c$) as a function of an external magnetic field was measured also in the oxygen-modified monoliths at 75 K in small samples (diameter=4 mm, height=2 to 3 mm), which were drilled out of the yttrium barium cuprate monoliths. Subsequently, the critical current density was determined at increasing field strengths of an external magnetic field (from 0 to 8 tesla).

It has been found that through the specific $O_2$ treatment according to the invention, the critical current density with increasing external magnetic field remains constant at a very high level over a wide range, irrespective of the external magnetic field applied.

Based on these improved properties, the powders or molded bodies according to the invention, especially the oxygen-modified ones, are particularly well suited for applications in which current is to be conducted in the presence of an external magnetic field.

The foregoing description and examples have been set forth merely to illustrate the invention and are not intended to be limiting. Since modifications of the disclosed embodiments incorporating the spirit and substance of the invention may occur to persons skilled in the art, the invention should be construed broadly to include all variations falling within the scope of the appended claims and equivalents thereof.

What is claimed is:

1. A superconducting molded body based on a cuprate material and obtained by melt texturing, wherein said body has a zinc cation content of 50 to 5000 ppm by weight.

2. A superconducting body according to claim 1, wherein said superconducting body has a zinc cation content in the range from 100 to 1000 ppm by weight.

3. A superconducting body according to claim 1, wherein said cuprate material is a rare earth metal barium cuprate material or a bismuth (lead) alkaline-earth metal copper oxide material.

4. A superconducting body according to claim 3, wherein said cuprate material is a rare earth metal barium cuprate material and further comprises cations of at least one element selected from the group consisting of strontium and calcium.

5. A superconducting body according to claim 1, further comprising aluminum cations in an amount of from 2 to 100 ppm by weight.

6. A superconducting body according to claim 5, comprising aluminum cations in an amount of from 5 to 10 ppm by weight.

7. A superconducting body according to claim 1, wherein said body contains a total amount of zinc cations, strontium cations, calcium cations, and aluminum cations of 1200 ppm or less by weight.

8. A superconducting body according to claim 1, wherein said superconducting body is obtained by heating the molded body at a temperature of 300° to 570° C. for up to 200 hours in a pure oxygen atmosphere or in an inert gas mixture containing 0.1 to 20% by weight of oxygen, and subsequently slowly cooling the heated body.

9. A superconducting body according to claim 8, wherein said superconducting body is obtained by heating the molded body at a temperature of between 480° and 520° C. for at least 50 hours in a pure oxygen atmosphere.

10. A superconducting body according to claim 9, wherein said superconducting body is obtained by heating the molded body for from 100 to 200 hours.

11. A superconducting body according to claim 8, wherein said superconducting body is obtained by heating the molded body at a temperature of from 300° to 500° C. in an inert gas mixture containing 0.1 to 20% by weight of oxygen.

12. A superconducting body according to claim 8, wherein said superconducting body is obtained by a process in which the molded body is held at a temperature of 550° to 600° C. for up to 100 hours prior to treatment with oxygen.

13. A superconducting body according to claim 1, wherein said body is configured as a target.

14. A superconducting body according to claim 1, wherein said body is formed into a superconducting cable, permanent magnet, short circuit current limiter, transformer, generator, SMES, flywheel energy storage system, high-field magnet, electromagnet or superconducting magnetic bearing.

15. A cuprate powder for producing superconducting material, said powder having a zinc cation content in an amount of 50 ppm to 1000 ppm by weight and a grain size distribution of $d_{90\%}$ of less than 35 μm determined by a CILAS laser granulometer.

16. A powder according to claim 15, wherein said powder is a $YBa_2Cu_3O_{7-x}$ powder or a bismuth (lead) alkaline-earth metal copper oxide powder.

* * * * *